United States Patent [19]
Johnson

[11] Patent Number: 6,038,114
[45] Date of Patent: Mar. 14, 2000

[54] MOTOR CONTROLLER HAVING DELTA MOTOR WIRING ERROR DETECTION CAPABILITY

[75] Inventor: Lynn Stewart Johnson, Aurora, Ill.

[73] Assignee: Siemens Energy & Automation, Inc., Alpharetta, Ga.

[21] Appl. No.: 09/164,871

[22] Filed: Oct. 2, 1998

[51] Int. Cl.[7] .................................................... H02H 5/04
[52] U.S. Cl. ............................. 361/23; 361/79; 361/88; 318/490; 324/522; 324/722
[58] Field of Search .................................. 361/23, 30, 31, 361/86, 88, 90, 91.1, 91.2, 78, 79; 340/660, 661; 323/282, 285; 318/490, 434, 519; 324/522, 521, 629, 647, 772

[56] References Cited
U.S. PATENT DOCUMENTS

| | | | |
|---|---|---|---|
| 4,140,950 | 2/1979 | Volk, Jr. | 318/749 |
| 4,492,878 | 1/1985 | Hamel | 307/127 |
| 5,469,351 | 11/1995 | Masrur et al. | 363/56 |
| 5,477,412 | 12/1995 | Neiger et al. | 361/45 |
| 5,563,489 | 10/1996 | Murry | 318/778 |
| 5,574,346 | 11/1996 | Chavan et al. | 318/434 |
| 5,894,392 | 4/1999 | McDonald | 361/42 |

*Primary Examiner*—Jeffrey Gaffin
*Assistant Examiner*—Kim Huynh

[57] ABSTRACT

Problems associated with delta motors and motor controllers being subjected to increased motor torques and overcurrent conditions as well as with time consuming troubleshooting are eliminated in a motor controller that automatically inhibits operation of the delta motor when it detects common wiring errors that occur during the installation process.

14 Claims, 10 Drawing Sheets

L1-L2
FROM UTILITY POWER

L2-L3
FROM UTILITY POWER

L3-L1
FROM UTILITY POWER (L1-T1>0)
EXPECTED SIGNAL FROM DELTA MOTOR (L2-T2>0)
EXPECTED SIGNAL FROM DELTA MOTOR (L3-T3>0)
EXPECTED SIGNAL FROM DELTA MOTOR

L1-L2
FROM UTILITY POWER

L2-L3
FROM UTILITY POWER

L3-L1
FROM UTILITY POWER (L1-T1=0)

(L2-T2=0)

(L3-T3=0)

MOTOR CONTROLLER HAVING DELTA MOTOR WIRING ERROR DETECTION CAPABILITY

FIELD OF THE INVENTION

This invention relates to motor controllers and more particularly, to a delta motor controller that automatically detects when a delta motor system has been wired incorrectly.

BACKGROUND OF THE INVENTION

A delta motor system typically includes a delta motor, a three phase power source, a fault contactor and a motor controller. During start up, delta motors often experience potentially damaging high inrush currents and starting torques. This can adversely effect the performance of the motor drive and increase general wear and tear leading to higher maintenance costs. In addition, current peaks during motor startup can also cause voltage disturbances in the power supply.

Motor controllers are typically used to restrict the motor torque and reduce the high starting currents by controlling the application of voltage from the three phase power source to the delta motor. The motor controller generally includes a set of three control switches that are connected between the line voltage terminals of the three phase power source and the windings of the delta motor. The motor controller regulates the voltage from the three phase power source to the delta motor by selectively opening and closing the three control switches. The proper operation of the delta motor is dependent on the proper regulation of the control switches.

The fault contactor is commonly used to disconnect the three phase power source from the delta motor in the event that the delta motor system malfunctions. The fault contactor includes a set of three contacts that are also connected between each of the delta motor windings and the line voltage terminals. Each of the delta motor windings are intended to receive the fault contact connection on one side and the control switch connection on the other side. Alternatively, the fault contactor function can also be done with a shunt trip circuit breaker, an in-line contactor, or fuses.

The motor controller's internal timing mechanisms are specifically designed to regulate the application of specific line voltages from the three phase power source to specific delta motor windings based on a predesignated wiring configuration. Conventional electrical leads are typically used to connect the delta motor windings to the control switches and to the fault contacts. Since the electrical leads providing connection to the delta motor terminals are not always clearly marked, mistakes in wiring the delta motor system are common. Some of the most common wiring errors involve a single dead ended motor winding, three dead ended windings and swapping the delta motor connections to the motor controller with the delta motor connections to the fault contactor.

A wiring configuration includes a single dead ended winding when the two leads providing connection to a single winding are electrically coupled to a single line voltage terminal while the other two windings are connected in parallel across the remaining two line voltages terminals. In this configuration, the dead ended winding does not have any current flowing through it while the other two windings are subjected to lower motor torque and significantly higher current conditions. The lower motor torque in combination with the higher operating current can potentially damage both the delta motor and the motor controller.

When each of the three line voltage terminals of a three phase power source have been connected such that both ends of each motor winding are connected to the same line voltage terminal, the windings are incorrectly wired in a dead ended winding configuration. When a run command is issued to a delta motor having all of its windings in a dead ended configuration, the indicator for the motor controller will show that it is running and the indicator for the delta motor will show that the delta motor is up to speed even though the delta motor has not actually started and there is no current flowing through the windings.

Finally the third wiring error occurs when the delta motor terminals designated for connection to the motor controller control switches are connected to the fault contacts and the motor terminals designated for connection to the fault contacts are connected to the control switches. In this wiring configuration, the phase shift in the currents through each of the windings are no longer compatible with motor controller's internal mechanisms and although the delta motor will run, the motor controller will be unable to perform its necessary current limiting functions during start up or will be unable to supply full voltage to the motor for operation after starting.

Clearly it would be desirable to use a motor controller that automatically detects a fault condition if the motor system has been incorrectly wired having a single motor winding configured in a dead ended configuration or having all three of the motor windings configured in a dead ended configuration or if the delta motor connections to the fault contactor and to the motor controller have been swapped. Detecting these fault conditions prior to operating the delta motor enables the user to correct the faulty wiring prior to subjecting the delta motor and the motor controller to potentially damaging overcurrent and low motor torque conditions. In addition, automatic detection of these faults reduces troubleshooting time and associated expenses. The present invention seeks to achieve these objectives.

SUMMARY OF THE INVENTION

It is a principal object of this invention to provide a new and improved motor controller that automatically detects when a delta motor is wired incorrectly within a motor system. More specifically, it is an object of the invention to provide a motor controller that detects the faulty wiring prior to starting the delta motor so that the incorrect wiring can be corrected and the delta motor and the motor controller are not subjected to potentially damaging overcurrent and low motor torque conditions. It is also an object of the invention to facilitate the installation process so that troubleshooting time and associated expenses are reduced.

An exemplary embodiment of the invention achieves the foregoing objects in a motor controller for use in a motor system including a multiphase power source having three supply lines and a delta motor having three windings.

The motor controller includes a plurality of switching means and an error detecting means. Each of the switching means is intended to be operably connected in series with a selected one of the windings and between an associated selected pair of the supply lines. The error detecting means is operably connected across each of the switching means to detect a fault condition if at least one of the switching means is not connected across its associated selected pair of supply lines.

It is a feature of the invention that an indicating means is connected to the error detecting means to generate an indication in response to the fault condition.

In one embodiment, the plurality of switching means comprise solid state devices.

In another embodiment, the plurality of switching means comprise SCRs or triacs.

In another form of the invention, the error detecting means includes a sensing means that is operably connected across the switching means and generates a plurality of outputs representative of the voltages across each of the switching means and of the voltages across the first and second supply lines, the second and third supply lines and the third and first supply lines.

In another form of the invention, the error detecting means includes a decoding means operably connected to the sensing means for detecting a first fault condition if the voltages across the second and third switching means are synchronously greater than zero and the voltage across the first switching means is equal to zero or if the voltages across the first and third switching means are synchronously greater than zero and the voltage across the second switching means is equal to zero or if the voltages across the first and second switching means are synchronously greater than zero and the voltage across the third switching means is equal to zero.

In yet another form of the invention, the error detecting means includes a decoding means operably connected to the sensing means for detecting a second fault condition if the voltages across each of the individual switching means is equal to zero.

In another form of the invention, the error detecting means includes a decoding means operably connected to the sensing means for detecting a third fault condition if the voltage across the first switching means and the voltage across the first and third supply lines are synchronously greater than zero and the voltage across the second switching means and the voltage across the second and first supply lines are synchronously greater than zero and the voltage across the third switching means and the voltage across the third and second supply lines are synchronously greater than zero.

Other objects and advantages of the invention will become apparent from the following specification taken in conjunction with the accompanying drawings.

DETAILED DESCRIPTION OF THE DRAWINGS

Figure 1:
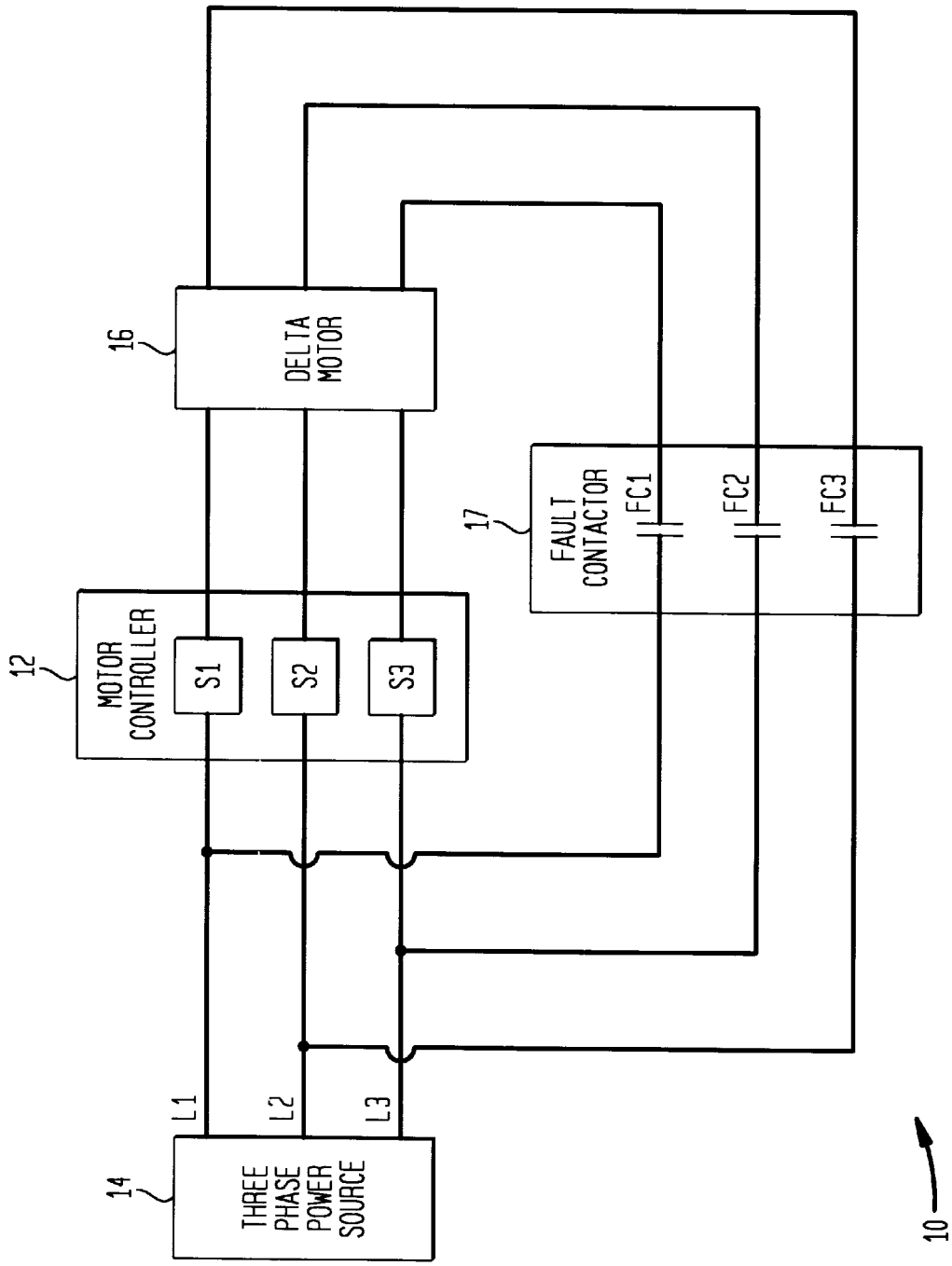
FIG. 1 shows a delta motor system including a prior art motor controller.

A diagram of a conventional delta motor system 10 including a prior art motor controller 12 is depicted in FIG. 1. The delta motor system 10 typically consists of a three phase power source 14, a delta motor 16, a fault contactor 17 and a motor controller 12. The motor controller 12 generally includes a set of three control switches S1, S2, S3 for providing electrical connection between the line voltage terminals L1, L2, L3 of the three phase power source 14 and the delta motor 16. The motor controller 12 regulates the voltage applied to the delta motor 16 by selectively opening and closing the three control switches S1, S2, S3. The proper operation of the delta motor 16 is dependent upon the proper regulation of the control switches S1, S2, S3.

The fault contactor 17 also includes a set of three contacts FC1, FC2, FC3 that are pre-connected between line voltage terminals L1, L2, L3 and the delta motor 16 in a preferred embodiment, as shown in FIG. 1. Alternatively, the fault contactor 17 may be connected between line voltage terminals L1, L2, L3 and the controller 12, as is known. The fault contactor 17 is used to disconnect the three phase power source 14 from the delta motor 16 in the event that the delta motor system 10 experiences a malfunction.

Figure 2:
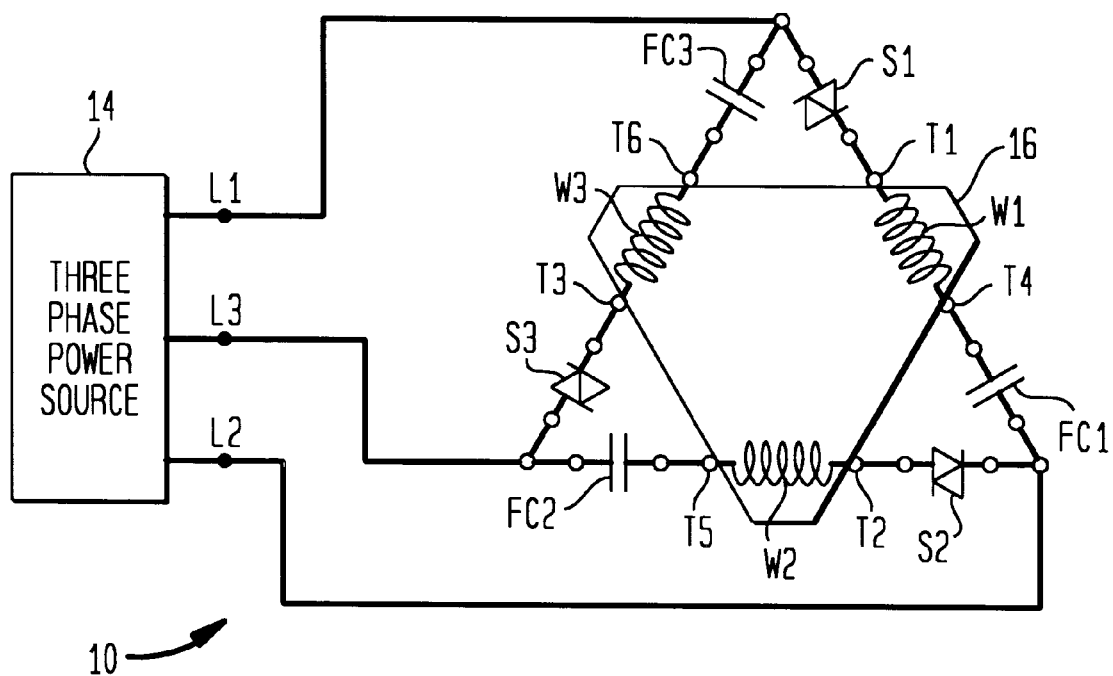
FIG. 2 illustrates the relationships between the delta motor windings, the motor controller control switches and the fault contactor contacts necessary for proper motor controller operation.

FIG. 2 illustrates in detail the necessary relationships between the delta motor windings W1, W2, W3, the line voltage terminals L1, L2, L3, the fault contacts FC1, FC2, FC3 and the motor controller control switches S1, S2, S3 for proper motor controller operation with the preferred embodiment. The motor controller's internal timing mechanisms are specifically designed to regulate the application of the three phase voltage from the three phase power source 14 to the delta motor windings W1, W2, W3 based on a predesignated wiring configuration.

The delta motor 16 consists of three windings W1, W2, W3 arranged in a delta configuration. Each winding W1, W2, W3 has a pair of associated motor terminals T1 and T4, T2 and T5, T3 and T6 respectively, that provide electrical connection to either side of each individual winding W1, W2, W3. Terminals T1, T2 and T3 are designated for connection to line voltage terminals L1, L2 and L3 respectively using the control switches S1, S2 and S3 respectively. Terminals T4, T5 and T6 are designated for connection to line voltage terminals L2, L3 and L1 respectively using fault contacts FC1, FC2 and FC3 respectively.

The overall layout of the control switches and the windings can be described as follows in one embodiment: control switch S1, winding W1, fault contact FC1 are connected in series across line voltage terminals L1 and L2; control switch S2, winding W2, and fault contact FC2 are connected in series across line voltage terminals L2 and L3; and control switch S3, winding W3, and FC3 are connected in series across line voltage terminals L3 and L1. It is essential that the motor terminals T1, T2, T3, T4, T5, T6 be wired with the appropriate control switches S1, S2, S3 and the appropriate fault contacts FC1, FC2, FC3 across the appropriate line voltage terminals L1, L2, L3 to enable the motor controller 12 to perform its motor torque restricting and current limiting functions.

Figure 3A:
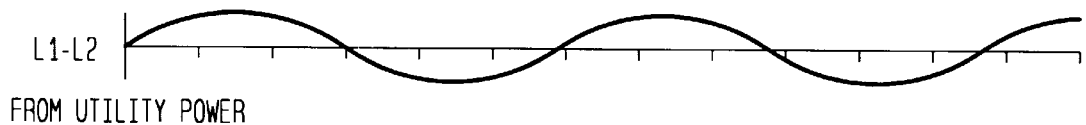
FIGS. 3A–3F illustrate the waveforms for the line to line voltages and the digital signals representative of the voltages across the individual control switches for a correctly wired delta motor system.
Figure 3B:
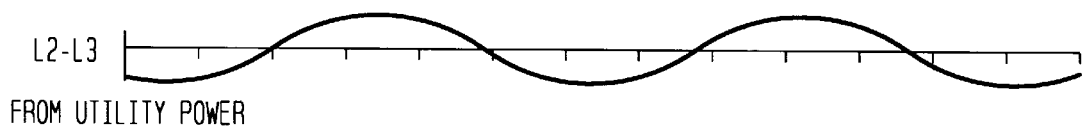
Figure 3C:
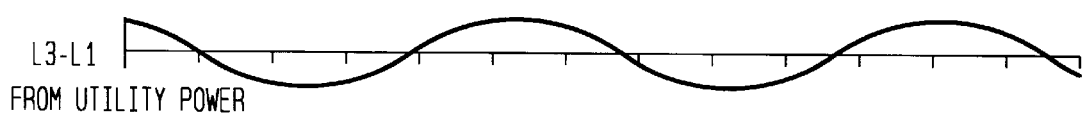
Figure 3D:
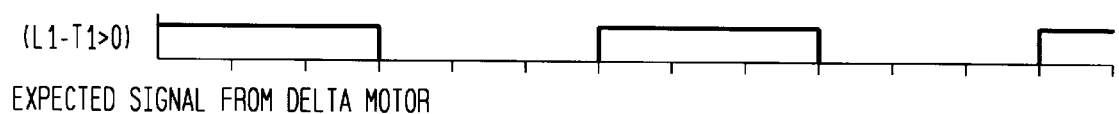
Figure 3E:
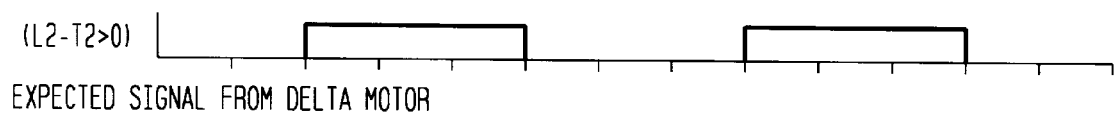
Figure 3F:

FIG. 3 illustrates the waveforms for the line to line voltages (L1-L2), (L2-L3) and (L3-L1) and the digital signals showing when each of the voltages across the control switches (L1-T1), (L2-T2), (L3-T3) are greater than zero for a correctly wired delta motor system 10. The following observations can be made when the delta system 10 is correctly configured for operation:

(i) the first control switch S1 is connected across line voltage terminals L1 and L2 and the voltage across the first control switch (L1-T1), shown in FIG. 3(d), and the line to line voltage (L1-L2), shown in FIG. 3(a), are synchronously greater than zero;

(ii) the second control switch S2 is connected across line voltage terminals L2 and L3 and the voltage across the second control switch (L2-T2), shown in FIG. 3(e), and the line to line voltage (L2-L3), shown in FIG. 3(b), are synchronously greater than zero; and (iii) the third control switch S3 is connected across line voltage terminals L3 and L1 and the voltage across the third control switch (L3-T3), shown in FIG. 3(f), and the line to line voltage (L3-L1), shown in FIG. 3(c), are synchronously greater than zero.

Conventional leads are typically used to connect the delta motor windings W1, W2, W3 to the control switches S1, S2, S3 and to the fault contacts FC1, FC2, FC3. The electrical leads providing connection to the delta motor terminals T1, T2, T3, T4, T5 and T6 are not always clearly marked. As a result wiring mistakes during the installation process of the delta motor system 10 are common.

Figure 4:
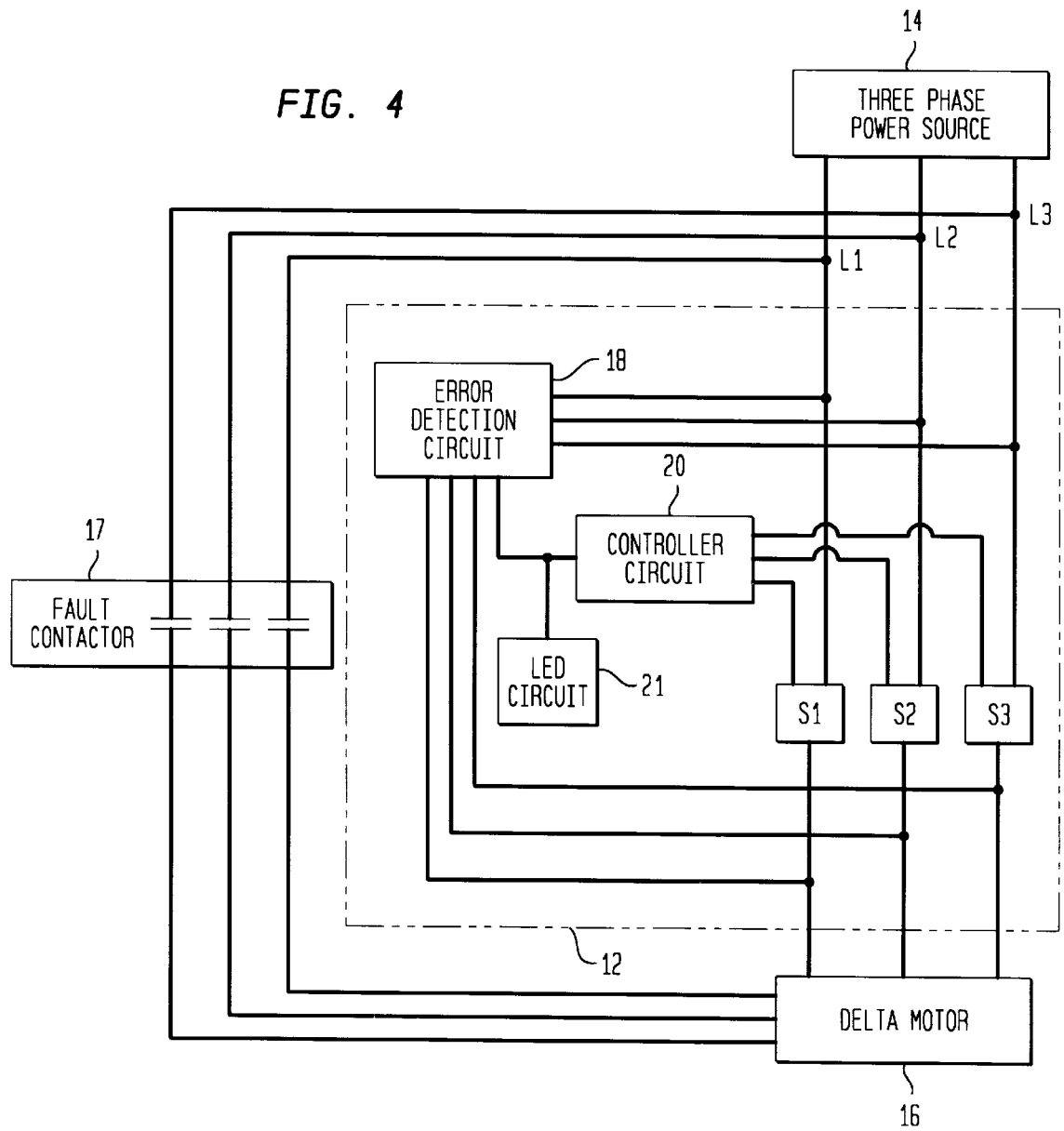
FIG. 4 depicts the motor controller according to the invention connected within a delta motor system.

The motor controller 12 according to the invention, shown in FIG. 4, detects three very common wiring errors: a single delta motor winding wired in a dead ended configuration; all three delta motor windings wired in dead ended configurations; and a swapped lead configuration where the delta motor leads intended for connection to the motor controller 12 have been swapped with the delta motor leads intended for connection to the fault contactor 17.

The motor controller 12 includes an innovative error detection circuit 18 that is electrically coupled to the line voltage terminals L1, L2, L3 and to motor terminals T1, T2, T3, across each of the individual control switches S1, S2, S3. The error detection circuit 18 manipulates the voltage readings obtained from the line voltage terminals L1, L2, L3 and the motor terminals T1, T2, T3 prior to starting the delta motor 16 to identify if the motor system 10 is wired in one of the three incorrect wiring configurations. The error detection circuit 18 generates a first signal in response to a single dead ended winding, a second fault signal in response to three dead ended windings and a third fault signal in response to a swapped lead configuration.

The controller circuit 20, connected to each of the control switches S1, S2, S3 and the error detection circuit 18, controls the application of voltages from the three phase power source 14 to the delta motor 16 by controlling the operation of the control switches S1, S2, S3. The controller circuit 20 responds to each of the fault signals generated by the error detection circuit 18 by inhibiting operation of the delta motor 16. In addition, the error detection circuit 18 also directs each of the fault signals to an indicator circuit, such as for example, an LED circuit 21 with an LED associated with each of the fault signals. The LED circuit 21 provides the user with notice of the specific type of wiring error detected.

Solid state switches such as SCRs or triacs are used for the control switches S1, S2, S3 in a preferred embodiment of the invention, however, the use of alternative switching mechanisms are also considered to be within the scope of the invention. In addition, in the illustrated embodiment, the controller circuit 20 comprises a programmed microcontroller. It should be noted that alternative hardware or software implementations of the controller circuit 20 are also within the spirit of the invention.

The first type of wiring configuration error detected by the error detecting circuit 18 is a single dead ended winding configuration. This wiring error occurs when the two leads of a single motor winding have been electrically coupled to the terminals of a single line voltage and the other two windings have been connected in parallel across the remaining line voltages' terminals. Under these conditions, the dead ended winding will not have any current flowing through it while the other two windings will have a potentially damaging combination of very large currents and very low motor torques.

Figure 5:
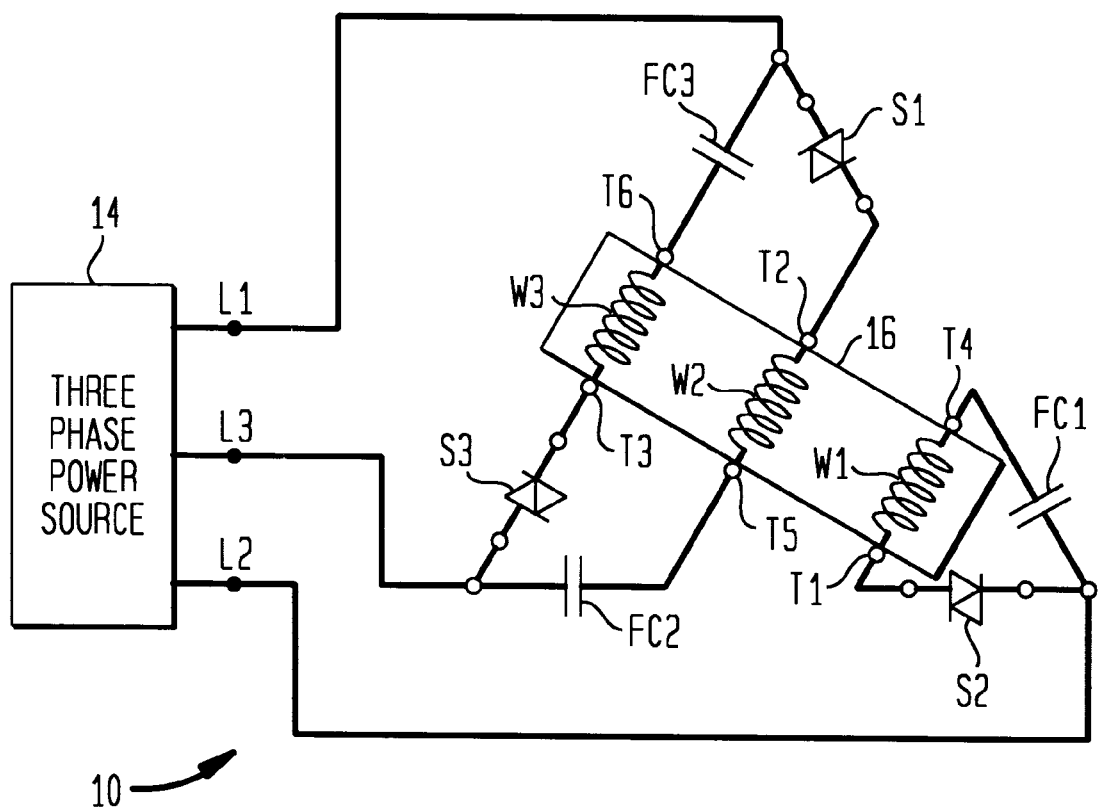
FIG. 5 shows an example of a delta motor system wired in a single dead ended winding configuration where two leads providing connection to a single winding are connected to a single line voltage.

FIG. 5 depicts an example of a single dead ended winding configuration where the winding W1 has been dead ended with no current flowing through it and windings W2 and W3 are connected in parallel and are running under overcurrent conditions. The illustrated single dead ended configuration can be described as follows: winding W1 has both terminals T1 and T4 electrically coupled to line voltage terminal L2 with control switch S2 connected between terminal T1 and line voltage terminal L2; winding W2 is electrically coupled across line voltage terminals L1 and L3 with control switch S1 connected between terminal T2 and line voltage terminal L1; and winding W3 is also electrically coupled across line voltage terminals L1 and L3 parallel to winding W2 with control switch S3 connected between terminal T3 and line voltage terminal L3.

Figure 6:
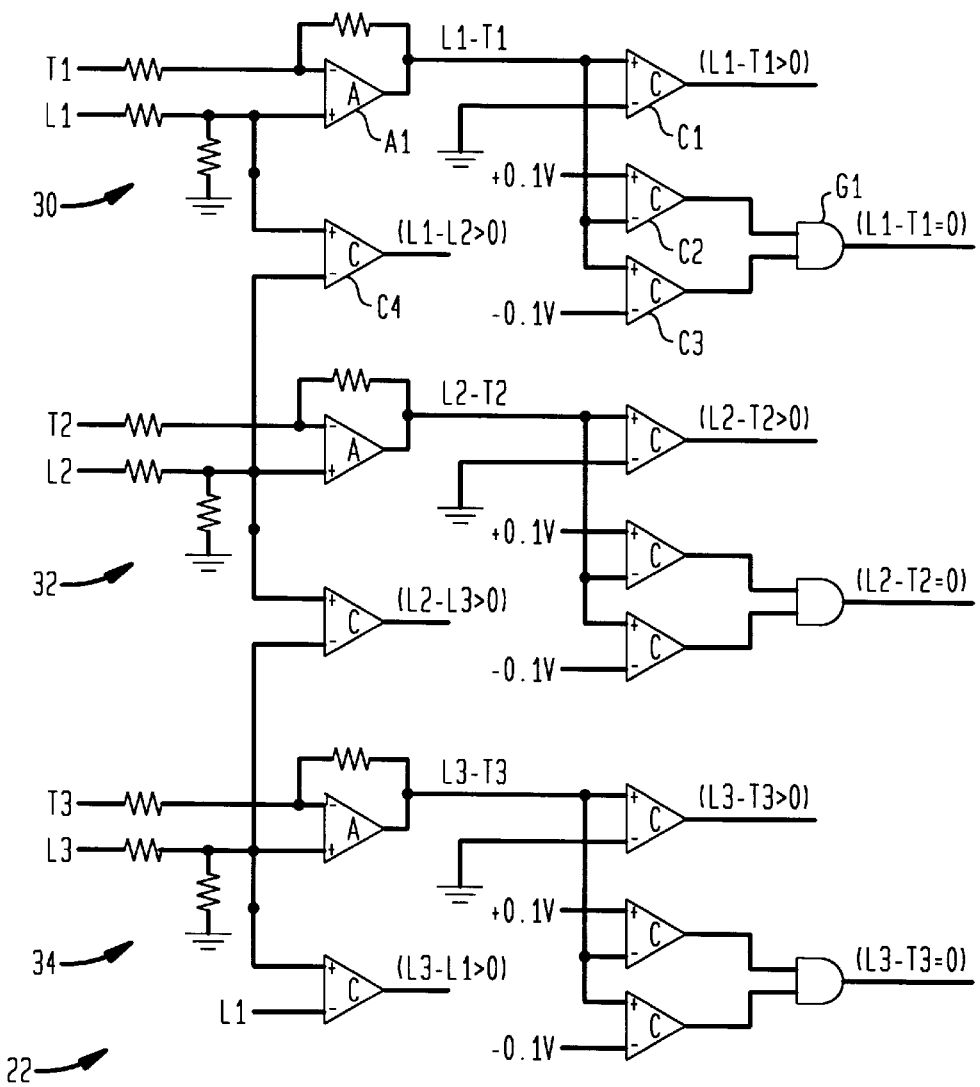
FIG. 6 is a schematic representation of the sensing circuit.
Figure 7:
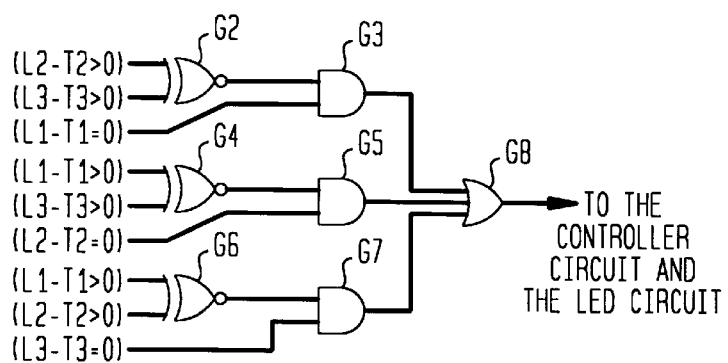
FIG. 7 is a schematic representation of the decoding circuit for detecting a single dead ended winding wiring error.
Figure 10:
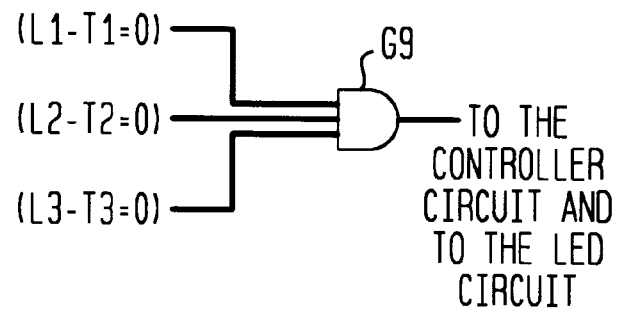
FIG. 10 is a schematic representation of the decoding circuit for detecting if all of the delta motor windings are in a dead ended configuration.
Figure 13:
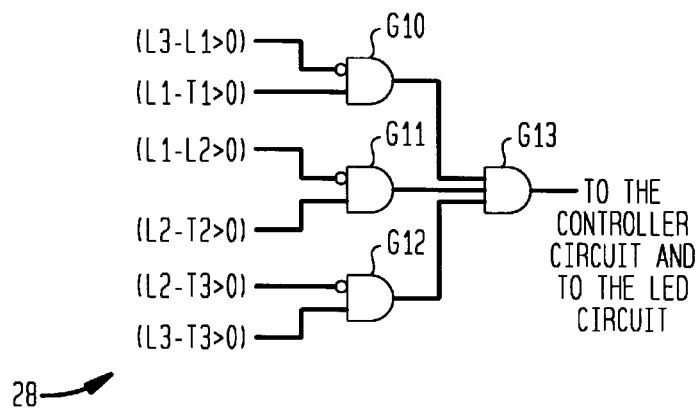
FIG. 13 is a schematic representation of the decoding circuit for detecting if the fault contactor connections and the motor controller switch connections to a delta motor's windings have been swapped.
Figure 14A:
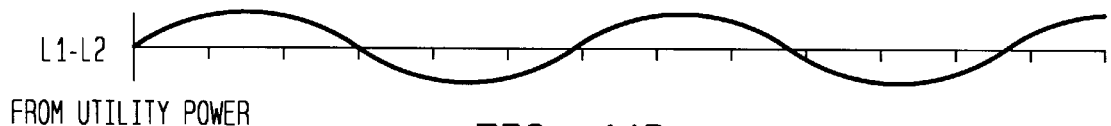
FIGS. 14A–14F illustrate the waveforms for the line to line voltages and the digital signals representative of the voltages across the individual control switches for a delta motor system where the fault contact connections and the control switch connections to the delta motor have been swapped.
Figure 14B:
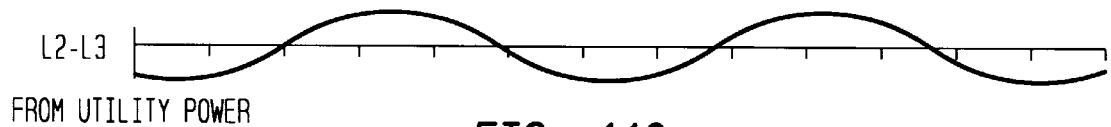
Figure 14C:
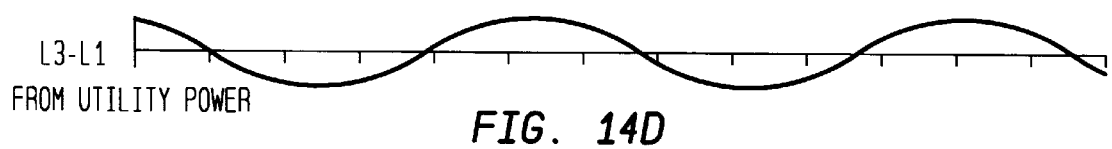
Figure 14D:
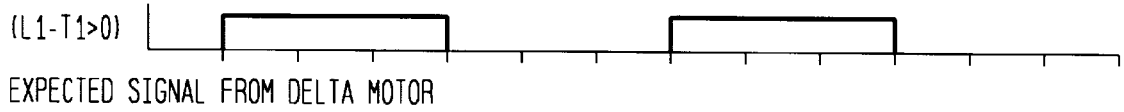
Figure 14E:
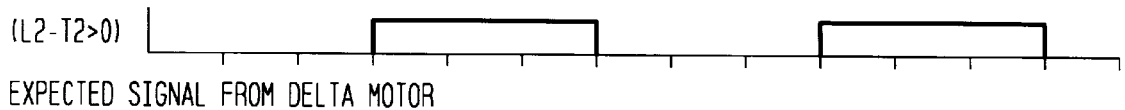
Figure 14F:
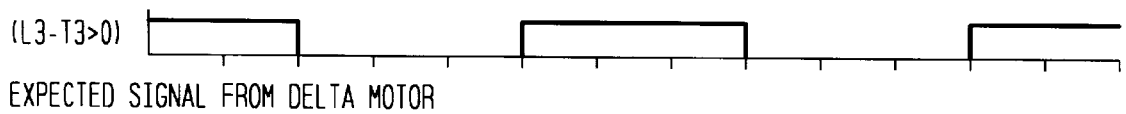

The error detection circuit 18 includes a sensing circuit 22, shown in FIG. 6 and three decoding circuits 24, 26, 28 shown in FIG. 7, FIG. 10 and FIG. 13 respectively. Each of the individual decoding circuits 24, 26, 28 manipulates the relevant sensing circuit 22 outputs to identify if the delta motor system 10 is wired in one of the three erroneous wiring configurations. The sensing circuit 22 works in conjunction with the first decoding circuit 24 to identify if the delta motor system 10 is wired in a single dead ended configuration.

The sensing circuit 22, shown in FIG. 6, accepts the three line voltages L1, L2, L3 and the three voltages at the three motor terminals designated for control switch connections T1, T2, T3 as inputs and generates a true signal for each of the following conditions that are found to be true:

Voltages Across Control Switches
Voltage (L1-T1)>0
Voltage (L2-T2)>0
Voltage (L3-T3)>0
Voltage (L1-T1)=0
Voltage (L2-T2)=0
Voltage (L3-T3)=0
Line to Line Voltages
Voltage (L1-L2)>0
Voltage (L2-L3)>0
Voltage (L3-L1)>0

The sensing circuit 22 consists of three similar subcircuits 30, 32, 34. The first subcircuit 30 consists of an amplifier A1, four comparators C1, C2, C3, C4 and an AND gate G1. The amplifier A1 accepts the voltage at motor terminal T1 as its negative input and the line voltage at terminal L1 as its positive input and generates the difference between the two (L1-T1), the voltage across control switch S1, as its output. This output (L1-T1), is directed into the positive input of the first comparator C1 and the negative input is connected to a ground signal. The comparator C1 compares the input signal (L1-T1), to the ground signal and generates a true signal when (L1-T1), the voltage across control switch S1, is greater than zero.

The comparator C2 accepts the amplifier A1 output, (L1-T1), as its negative input and a reference voltage +0.1 volts as its positive input and generates a true signal when (L1-T1) is less than +0.1 volts. Comparator C3 accepts the amplifier A1 output, (L1-T1), as its positive input and another reference voltage −0.1 volts as its negative input and issues a true signal when (L1-T1) is greater than −0.1 volts.

The AND gate G1 accepts the output from comparator C2 indicating whether the voltage (L1-T1) is less than +0.1 volts and the output from comparator C3 indicating whether the voltage (L1-T1) is greater than −0.1 volts as inputs and generates a true signal when both conditions are true, in other words when the voltage across the control switch S1 is greater than −0.1 volts and less than +0.1 volts. The voltage across the control switch S1, (L1-T1), is then assumed to be zero.

The comparator C4 accepts the line voltage at terminal L1 as its positive input and the line voltage at terminal L2 as its negative input and generates a true signal when the line to line voltage (L1-L2) is greater than zero.

The second and third subcircuits 32, 34 operate similarly. The second subcircuit 32 accepts the voltages at the motor terminal T2 and at the line voltage terminals L2 and L3 as inputs and generates a first true signal when the voltage (L2-T2), the voltage across control switch S2, is greater than zero, a second true signal when the voltage (L2-T2) is between −0.1 volts and +0.1 volts and a third true signal when the line to line voltage (L2-L3) is greater than zero. Similarly, the third subcircuit 34 accepts the voltages at motor terminal T3 and at the line voltage terminal L3 and L1 as inputs and generates a first true signal when the voltage (L3-T3) across the control switch S3 is greater than zero, a second true signal when the voltage (L3-T3) is between the values −0.1 volts and +0.1 volts and a third true signal when the line to line voltage (L3-L1) is greater than zero.

The decoding circuit 24, shown in FIG. 7, is connected to the sensing circuit 22 and accepts the sensing circuit outputs necessary to make a determination regarding whether the delta motor system 10 is configured in a single dead ended configuration and issues a true signal in response to detecting such a configuration. The decoding circuit 24 consists of three pairs of XNOR and AND gates and an OR gate G8. The three pairs of gates are: XNOR gate G2 and AND gate G3; XNOR gate G4 and AND gate G5; and XNOR gate G6 and AND gate G7. The output generated by each of these pairs are input into the OR gate G8.

The operation of the first pair of gates, XNOR gate G2 and AND gate G3, can be described as follows. The XNOR gate G2 accepts the two signals indicating if the voltage (L2-T2) and the voltage (L3-T3) are both greater than or less than zero at the same time. Since the XNOR gate G2 inverts its output, a true signal is issued when both voltages (L2-T2) and (L3-T3) are both greater than or less than zero. A true output at the XNOR gate G2 indicates that the voltages across control switches S2 and S3 are in synch.

The AND gate G3 then accepts the XNOR gate G2 output and the signal indicating if the voltage (L1-T1) is equal to zero as inputs. A true signal is generated by the AND gate G3 when the voltage (L1-T1), the voltage across the first control switch S1, is equal to zero and the voltages (L2-T2) and (L3-T3), the voltages across the second and third control switches S2 an S3 are in synch. An AND gate G3 true signal indicates that the winding connected to the first control switch S1 is in in a single dead ended configuration.

The second pair of gates, XNOR gate G4 and AND gate G5, manipulate the input signals indicating if the voltages (L1-T1) and (L3-T3) are both greater than or less than zero and the input signal indicating if the voltage (L2-T2) is equal to zero in a similar manner. A true signal is generated at the output of AND gate G5 when the voltages across control switches S1 and S3 are in synch and the voltage across S2 is equal to zero indicating that the winding connected to the second control switch S2 is the dead ended winding.

Similarly, the XNOR gate G6 in the third pair also accepts the two signals indicating if the voltage (L1-T1) and the voltage (L2-T2) are both greater than or less than zero as inputs. The AND gate G7 accepts the XNOR gate G6 output and the signal indicating if the voltage (L3-T3) is equal to zero as inputs. The AND gate G7 generates a true output when the voltages across the first control switch S1 and across the second control switch S2 are in synch and the voltage across the third control switch S3 is equal to zero indicating that the winding connected to the third control switch S3 is in a single dead ended configuration.

The outputs generated by the three AND gates G3, G5 and G7 are all fed into the OR gate G8 as inputs. The OR gate then generates a true signal or a fault signal if any one of the AND gate G3, G5, G7 inputs are true indicating that one of the three windings W1, W2 or W3 has been wired in a dead ended configuration. The fault signal is then directed to the controller circuit 20 and the LED circuit 21.

When the delta motor system 10 is configured in a single dead ended configuration, the relationships between the voltages across the individual control switches S1, S2, S3 and the three line to line voltages are altered. These changed relationships are used by the decoding circuit 24 to identify the incorrect wiring configuration. FIG. 8 illustrates the waveforms for the digital signals representative of the voltages across the individual control switches (L1-T1), (L2-T2), (L3-T3) for a delta motor system 10 wired in a single dead ended winding configuration relative to the line to line voltages (L1-L2), (L2-L3), (L3-L1).

Figure 8A:
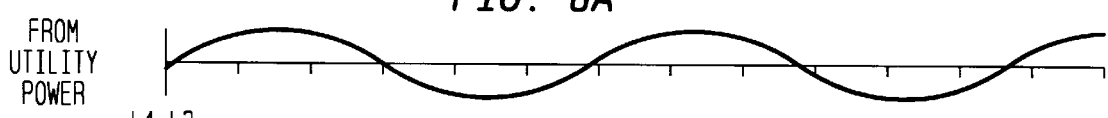
FIGS. 8A–8L illustrate the waveforms for the digital signals representative of the voltages across the individual control switches for a delta motor system for three different single dead ended winding configurations.
Figure 8B:
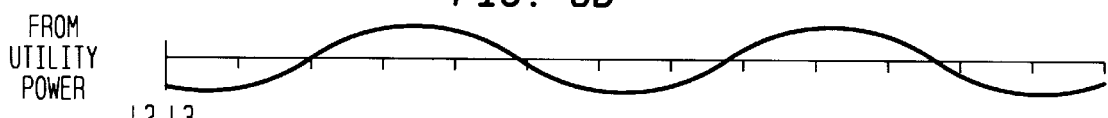

When the winding connected to the first control switch S1 is dead ended, there is no current flowing through that winding or control switch S1. Since the voltage across the control switch (L1-T1) is equal to zero, the digital signal indicating if the voltage (L1-T1) is greater than zero is true, as shown in FIG. 8(d). The other two windings and their associated control switches S2 and S3 are connected in parallel across line voltage terminals L2 and L3. The digital signals representing when the voltages (L2-T2 and (L3-T3) are greater than zero are shown in FIGS. 8(e) and (f) respectively and the waveform for line to line voltage (L2-L3) is shown in FIG. 8(b). Note that the voltages (L2-T2) and (L3-T3) across the two control switches S2 and S3 are in synch and if fact that they are in synch with the line to line voltage (L2-L3).

Figure 8C:
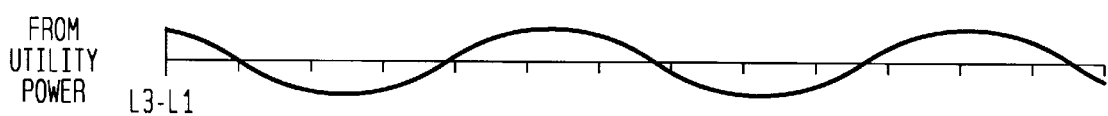
Figure 8D:
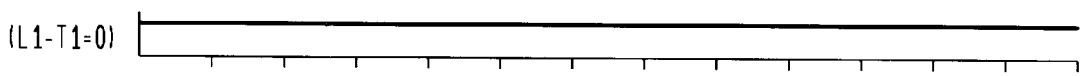
Figure 8E:
Figure 8F:
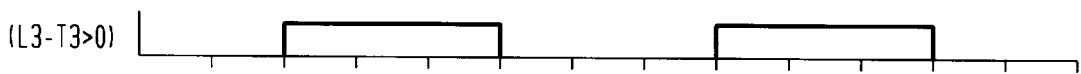
Figure 8G:
Figure 8H:
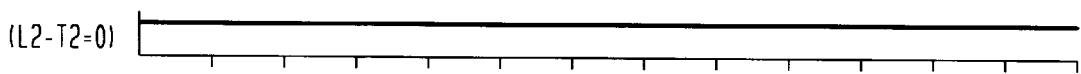
Figure 8I:
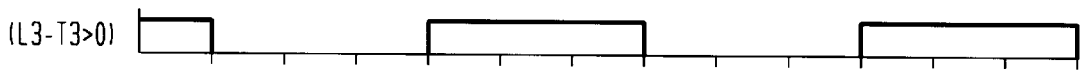
Figure 8J:
Figure 8K:
Figure 8L:
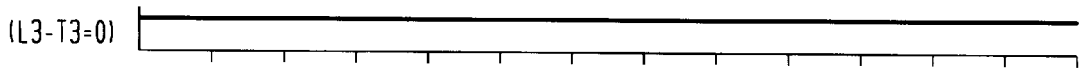

When the winding connected to the second control switch S2 is dead ended, comparable observations can be made regarding the relationships between the control switch voltages (L1-T1)—FIG. 8(g), (L2-T2)—FIG. 8(h), (L3-T3)—FIG. 8(i) and the line to line voltage (L3-L1) FIG. 8(c). A similar analysis can be made when the winding connected to the third control switch S3 is dead ended as can be seen by referring to FIG. 8(j) for voltage (L1-T1), FIG. 8(k) for voltage (L2-T2), FIG. 8(i) for voltage (L3-T3) and FIG. 8(a) for (L1-L2).

Figure 9:
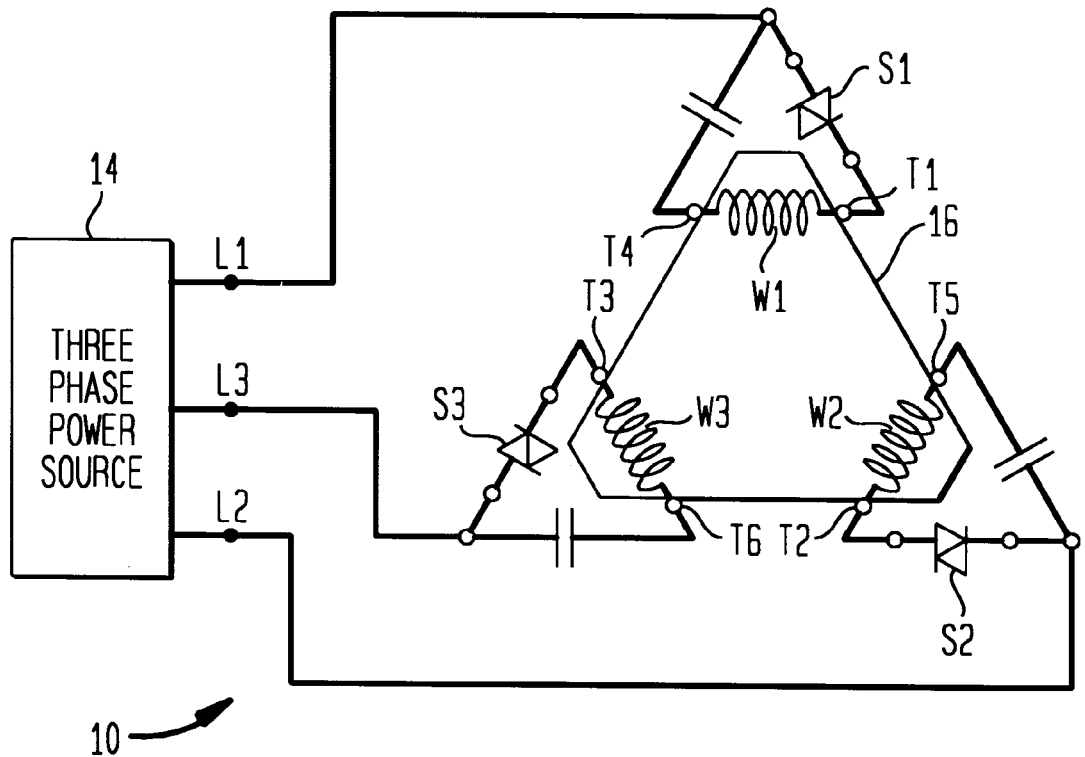
FIG. 9 shows a delta motor system having all of delta motor windings in a dead ended configuration.

The second type of wiring error detected by the error detection circuit 18 is the configuration where all of the delta motor windings are wired in a dead ended configuration, as illustrated in FIG. 9. Specifically, the delta motor terminals T4, T5, T6 designated for electrical connection to line voltage terminals L2, L3, L1, respectively have been connected to line voltage terminals L1, L2, L3, respectively. As a result, the winding W1 has both motor terminals T1, T4 connected to a single line voltage terminal L1, the winding W2 has both motor terminals T2, T5 connected to line voltage terminal L2 and the windings W3 has both motor terminals T3, T6 connected to line voltage terminal L3.

When the delta motor system 10 has been wired so that all three motor windings W1, W2, W3 are in a dead ended configuration and a run command is issued to the delta motor system 10, the indicator for motor controller 12 will show that it is running and the indicator for the delta motor 16 will show that the delta motor 16 is up to speed even though the delta motor 16 has not actually started and there is no current flowing through any of the windings W1, W2, W3.

The decoding circuit 26, shown in FIG. 10, accepts the outputs generated by the sensing circuit 22 necessary to identify if all of the motor windings W1, W2, W3 are dead ended and issues a true signal when the configuration is detected. The decoding circuit 26 consists of an AND gate G9. The AND gate G9 accepts the signals indicating if the voltages (L1-T1), (L2-T2), (L3-T3) are equal to zero as inputs. The decoding circuit 26 issues a fault signal if the voltages (L1-T1), (L2-T2), (L3-T3), the voltages across the control switches S1, S2, S3, are equal to zero. The fault signal is then routed to the controller circuit 20 and to the LED circuit 21.

When all three of the delta motor windings W1, W2, W3 are wired in a dead ended configuration, the voltages across the individual control switches S1, S2, S3 are altered. These changes are used by the decoding circuit 26 to identify the incorrect wiring configuration. FIG. 11 illustrates the waveforms for the digital signals representative of the voltages (L1-T1), (L2-T2), (L3-T3) across the individual control switches S1, S2, S3 relative to the line to line voltages (L1-L2), (L2-L3), (L3-L1).

Figure 11A:
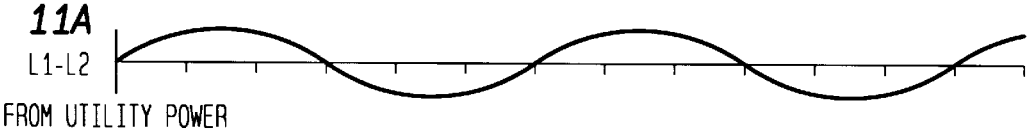
FIGS. 11A–11F illustrate the waveforms for the digital signals representative of the voltages across the individual control switches for a delta motor system having all of the delta motor windings wired in a dead ended configuration.
Figure 11B:
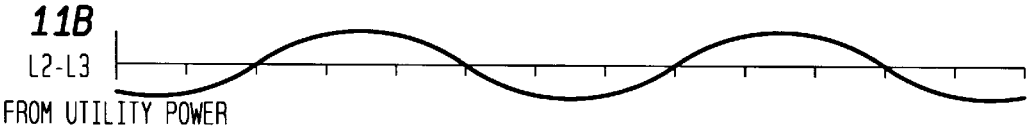
Figure 11C:
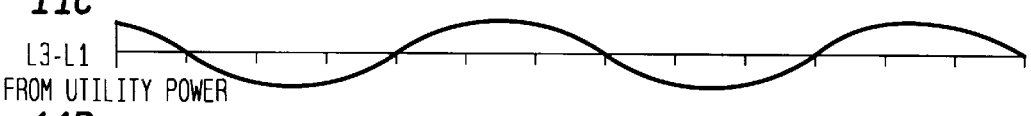
Figure 11D:
Figure 11E:
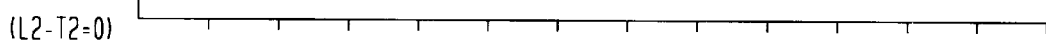
Figure 11F:
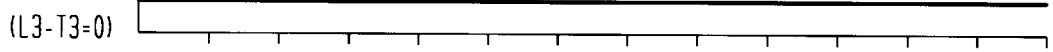

When each of the three of the windings W1, W2, W3 are wired to single line voltages' terminals so that they are dead ended, there is no current flowing through any of the windings W1, W2, W3 or the control switches S1, S2, S3 connected to the windings W1, W2, W3. As a result, there is no voltage across any of the control switches S1, S2, S3. The digital signals generated by the sensing circuit 22 indicating if the voltages (L1-T1), (L2-T2) and (L3-T3) across control switches S1, S2 and S3 are equal to zero are all true. This is shown in FIGS. 11(d), (e) and (f) respectively. The decoder circuit 26 logic identifies when the voltages across all of the individual control switches S1, S2, S3 are equal to zero and issues a fault signal indicating that all of the windings are dead ended.

Figure 12:
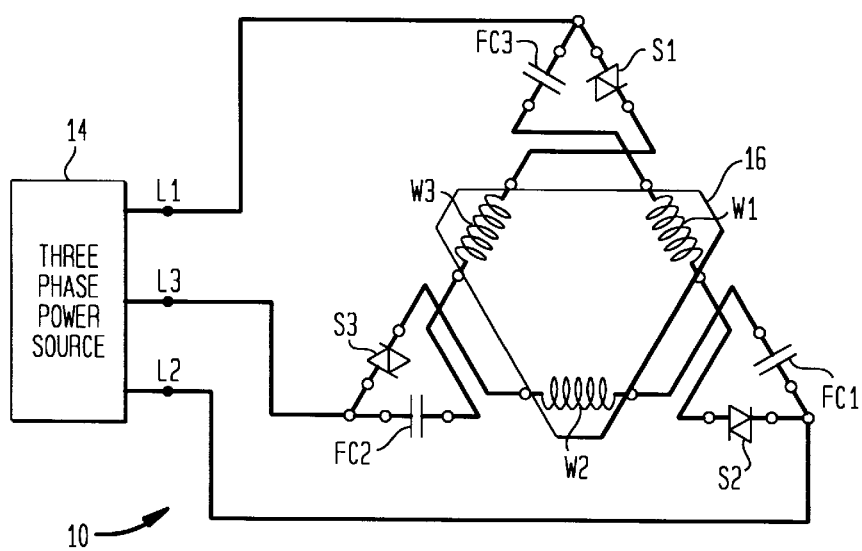
FIG. 12 shows a delta motor system wiring configuration where the fault contactor connections and the motor controller switch connections to a delta motor's windings have been swapped.

The third type of wiring error detected by the error detecting circuit 18 is the configuration where the connections to the fault contact terminals T4, T5, T6 of the delta motor 16 and connections to the control switch terminals T1, T2, T3 of the delta motor 16 have been swapped, as shown in FIG. 12. Specifically, the delta motor terminals T4, T5 and T6 designated for connection to the fault contacts FC1, FC2 and FC3 have been connected to the control switches S2, S3 and S1 respectively and the winding terminals T1, T2 and T3 designated for connection to the control switches S1, S2 and S3 have been connected to the fault contacts FC3, FC1 and FC2 respectively. In this wiring configuration, the phase shift in the currents flowing through each of the windings W1, W2, W3 are no longer be compatible with the motor controller's internal timing mechanisms and although the delta motor 16 will still run under these conditions, the motor controller 12 will be unable to perform its necessary current limiting functions during start up, or alternatively will be unable to supply full voltage for motor operation after starting.

The decoding circuit 28, shown in FIG. 13, accepts the digital output signals generated by the sensing circuit 22 relevant to determining if the delta motor system 10 is configured in a swapped lead configuration and issues a true signal when the configuration is detected. The decoding circuit 28 consists of four logical AND gates G1, G11, G12, G13. The first AND gate G10 accepts two signals as inputs: the inverse of the signal indicating if the line to line voltage (L3-L1) is greater than zero and the signal indicating if the voltage across the first control switch (L1-T1) is greater than zero and issues a true signal at its output when both inputs are true.

Similarly, the second AND gate G11 accepts the inverse of the signal indicating if the line to line voltage (L1-L2) is greater than zero and the signal indicating if the voltage across the second control switch (L2-T2) is greater than zero and generates a true signal as an output when both conditions are true. The third AND gate G12 also performs a similar comparison accepting the inverse of the signal for the line to line voltage (L2-L3) and the signal associated with the voltage across the third control switch (L3-T3) as inputs.

The fourth AND gate G13 accepts the outputs issued by the three AND gates G10, G11, G12 and generates a true signal or a fault signal when all three of the inputs are high indicating that in wiring the delta motor system 10, the delta motor fault contact leads have been swapped with delta motor control switch leads. The fault signal is then directed to the controller circuit 20 and the LED circuit 21.

When the delta motor system 10 is configured in the swapped wiring configuration, the relationships between the voltages across the control switches S1, S2, S3 and the line to line voltages (L1-L2), (L2-L3), (L3-L1) change. These changes are used by the decoding circuit 28 to identify the swapped lead configuration. FIG. 14 illustrates the waveforms for the line to line voltages (L1-L2), (L2-L3), (L3-L1) and the digital signals representative of the voltages across the individual control switches (L1-T1), (L2-T2), (L3-T3) as described below:

(i) the first control switch S1 is connected across line voltage terminals L1 and L3 and the voltage across the first control switch (L1-T1), shown in FIG. 8(d), and the inverse of the line to line voltage (L3-L1), shown in FIG. 8(c), are synchronously greater than zero;

(ii) the second control switch S2 is connected across line voltage terminals L2 and L1 and the voltage across the second control switch (L2-T2), shown in FIG. 8(e), and the inverse of the line to line voltage (L1-L2), shown in FIG. 8(a), are synchronously greater than zero; and (iii) the third control switch S3 is connected across line voltage terminals L3 and L2 and the voltages across the third control switch (L3-T3), shown in FIG. 8(f), and the inverse of the line to line voltage (L2-L3), shown in FIG. 8(b), are synchronously greater than zero.

In a preferred embodiment of the invention, the logical functions shown in the decoding circuits 24, 26, 28 are performed by the microcontroller that implements the functions of the controller circuit 20. While the illustrated embodiment focuses on a particular implementation of the error detection circuit 18, other equivalent hardware and software implementations of the logic disclosed also fall within the scope of the invention.

The motor controller 12, uses the error detection circuit 18 to identify if the delta motor system 10 is wired in a single dead ended configuration or a configuration where all of the windings W1, W2, W3 are dead ended or in a swapped lead configuration. Upon detection of one of the erroneous wiring configurations, the error detection circuit 18 generates a fault signal indicative of the specific wiring error. The fault signal is routed to the LED circuit 21 which lights the appropriate LED to provide notice of the incorrect wiring configuration to the user and to the controller circuit 20 which in turn inhibits operation of the delta motor 16.

It will be appreciated that since the entire error detection process occurs prior to actually turning on the delta motor 16, the delta motor 16 and the motor controller 12 are never exposed to potentially damaging increased motor torques and overcurrent conditions.

As is apparent, the motor system connections will be modified for the alternative fault contactor connections mentioned above. Nevertheless, the error detection circuit 18 operates as disclosed herein.

The foregoing disclosure of specific embodiments is intended to be illustrative of the broad concepts comprehended by the invention.

What is claimed is:

1. For use in a motor system including a multiphase power source having three supply lines and a delta motor having three windings, a motor controller comprising:

a plurality of switching means, each switching means intended to be operably connected in series with a selected one of the motor windings, each of these selected series connected winding and switching means is intended to be connected between an associated selected pair of the supply lines; and an error detecting means operably connected across each of the switching means to detect a fault condition if at least one of the switching means is not connected between its associated selected pair of supply lines, as intended.

2. The motor controller according to claim 1, including an indicating means connected to the error detecting means and operable to generate an indication in response to the fault condition.

3. The motor controller according to claim 1, wherein the plurality of switching means comprise solid state devices.

4. The motor controller according to claim 1, wherein the plurality of switching means comprise SCRs.

5. The motor controller according to claim 1, wherein the plurality of switching means comprise triacs.

6. For use in a motor system including a multiphase power source having three supply lines and a delta motor having three windings, each winding having a first lead and a second lead, the first lead of each winding intended to be operably connected to a selected supply line, a motor controller comprising:

a plurality of switching means each intended to be operably connected between a selected supply line and the second lead of a selected winding; and an error detecting means operably connected across each of the switching means to detect first, second and third fault conditions, wherein:

the first fault condition being detected if both the first and second leads of one of the windings are inadvertently connected to a single one of the supply lines, the second fault condition being detected if both the first and second leads of each winding are inadvertently connected to a single one of the supply lines, the third fault condition being detected if the first winding leads intended for connection to the supply lines are inadvertently connected to the switching means and the second winding leads intended for connection to the switching means are inadvertently connected to the supply lines.

7. The motor controller according to claim 6, wherein the error detecting means includes a sensing means operably connected across the switching means to generate a plurality of outputs representative of the voltages across each of the switching means and of the voltages across the first and second supply lines, the second and third supply lines and the third and first supply lines.

8. The motor controller according to claim 6, wherein the error detecting means includes a decoding means operably connected to a sensing means for detecting the first fault condition if the voltages across the second and third switching means are synchronously greater than zero and the voltage across the first switching means is equal to zero or if the voltages across the first and third switching means are synchronously greater than zero and the voltage across the second switching means is equal to zero or if the voltages across the first and second switching means are synchronously greater than zero and the voltage across the third switching means is equal to zero.

9. The motor controller according to claim 6, wherein the error detecting means includes a decoding means operably connected to the sensing means for detecting the second fault condition if the voltages across each of the individual switching means is equal to zero.

10. The motor controller according to claim 6, wherein the error detecting means includes a decoding means operably connected to the sensing means for detecting the third fault condition if the voltage across the first switching means and the voltage across the first and third supply lines are synchronously greater than zero and the voltage across the second switching means and the voltage across the second and first supply lines are synchronously greater than zero and the voltage across the third switching means and the voltage across the third and second supply lines are synchronously greater than zero.

11. The motor controller according to claim 6, including an indicating means connected to the error detecting means for generating first, second and third fault indications in response to the first, second and third fault conditions respectively.

12. The motor controller according to claim 6, wherein the plurality of switching means comprise solid state devices.

13. The motor controller according to claim 6, wherein the plurality of switching means comprise SCRs.

14. The motor controller according to claim 6, wherein the plurality of switching means comprise triacs.

* * * * *